US005790452A

United States Patent [19]

Lien

[11] Patent Number: 5,790,452

[45] Date of Patent: Aug. 4, 1998

[54] MEMORY CELL HAVING ASYMMETRICAL SOURCE/DRAIN PASS TRANSISTORS AND METHOD FOR OPERATING SAME

[75] Inventor: Chuen-Der Lien, Los Altos Hills, Calif.

[73] Assignee: Integrated Device Technology, Inc., Santa Clara, Calif.

[21] Appl. No.: 649,896

[22] Filed: May 2, 1996

[51] Int. Cl.[6] .................. G11C 11/412

[52] U.S. Cl. .................. 365/154; 365/178; 257/393; 257/903; 257/904; 257/906

[58] Field of Search .................. 365/149, 154, 365/156, 185.33, 178; 257/393, 903, 904, 905, 906, 907, 908

[56] References Cited

U.S. PATENT DOCUMENTS

| | | | |
|---|---|---|---|
| 4,698,787 | 10/1987 | Mukherjee et al. | 365/185.29 |
| 4,788,663 | 11/1988 | Tanaka et al. | 365/185.1 |
| 4,852,062 | 7/1989 | Baker et al. | 365/185.15 |
| 5,036,017 | 7/1991 | Noda | 437/41 |
| 5,255,219 | 10/1993 | Sakai | 365/185.32 |
| 5,289,406 | 2/1994 | Uramoto et al. | 365/104 |
| 5,315,545 | 5/1994 | Guo et al. | 365/156 |
| 5,328,863 | 7/1994 | Cappelletti et al. | 437/52 |
| 5,384,730 | 1/1995 | Vinal | 365/156 |
| 5,400,276 | 3/1995 | Takeguchi | 365/185.12 |
| 5,414,658 | 5/1995 | Challa | 365/185.06 |
| 5,439,835 | 8/1995 | Gonzalez | 437/35 |
| 5,446,688 | 8/1995 | Torimaru | 365/145 |
| 5,471,421 | 11/1995 | Rose et al. | 365/182 |
| 5,581,500 | 12/1996 | D'Souza | 365/154 |

*Primary Examiner*—David C. Nelms
*Assistant Examiner*—Andrew Q. Tran
*Attorney, Agent, or Firm*—Skjerven, Morrill, MacPherson, Franklin & Friel

[57] ABSTRACT

A memory cell having an asymmetrical transistor which provides access to a data storage circuit of the memory cell. The asymmetrical transistor exhibits a forward threshold voltage when forward biased and a reverse threshold voltage when reverse biased. The forward threshold voltage is less than the reverse threshold voltage. The asymmetrical transistor is connected such that during write-disturb mode, the asymmetrical transistor is reverse biased to provide a relatively high reverse threshold voltage. This high reverse threshold voltage minimizes subthreshold current leakage during write-disturb mode, thereby reducing the possibility of data corruption. During read mode, the asymmetrical transistor is forward biased to provide a relatively low forward threshold voltage. This low forward threshold voltage maximizes the read voltage applied to the data storage circuit through the asymmetrical transistor, thereby improving the stability of the memory cell.

7 Claims, 2 Drawing Sheets

MEMORY CELL HAVING ASYMMETRICAL SOURCE/DRAIN PASS TRANSISTORS AND METHOD FOR OPERATING SAME

FIELD OF THE INVENTION

The present invention relates to a semiconductor memory cell having one or more pass transistors which provide access to the data storage circuitry of the memory cell.

BACKGROUND OF THE INVENTION

FIG. 1 is a schematic diagram of a conventional static random access memory (SRAM) cell 100. SRAM cell 100 includes cross-coupled n-channel pull-down transistors 101–102, n-channel pass transistors 103–104, polycrystalline silicon load resistors 105–106, word line 110 and bit lines 111–112. In variations of SRAM cell 100, load resistors 105–106 are replaced with PMOS transistors or thin film transistors. However, in these variations, the PMOS transistors and thin film transistors perform the same function as load resistors 105–106. In the present specification, the term "SRAM cell" refers to each of these variations.

SRAM cell 100 stores a data value which can be identified by the voltages present on nodes 120 and 121. One of nodes 120 and 121 is pulled up to a high side voltage $V_H$, and the other one of nodes 120 and 121 is pulled down to a low side voltage $V_L$. For purposes of simplification, it is assumed that SRAM cell 100 is in a state in which node 120 is pulled down to the low side voltage $V_L$ and node 121 is pulled up to the high side voltage $V_H$. However, it is understood that the state of SRAM cell 100 can change numerous times during normal operation.

During normal operation, SRAM cell 100 is in one of four modes: (1) stand-by mode, (2) write mode, (3) write-disturb mode, or (4) read mode.

In stand-by mode, the voltage applied to word line 110 is low (e.g., $V_{SS}$ or ground), and the voltages applied to bit lines 111 and 112 are high (e.g., $V_{CC}$). Under these conditions, the high side voltage $V_H$ at node 121 is slightly lower than the $V_{CC}$ supply voltage because of the small voltage drop across load resistor 106. The low side voltage $V_L$ at node 120 under these conditions is approximately equal to the $V_{SS}$ supply voltage (e.g., 0 volts).

In write mode, a high voltage ($V_{CC}$) is applied to word line 110, thereby turning on pass transistors 103 and 104. To write a data value to SRAM cell 100 which is identified by a high side voltage $V_H$ at node 121 and a low side voltage $V_L$ at node 120, a high voltage (e.g., $V_{CC}$) is applied to bit line 112, and a low voltage (e.g., $V_{SS}$ ) is applied to bit line 111. During these conditions, the high side voltage $V_H$ at node 121 is approximately equal to the word line voltage ($V_{CC}$) minus the backgate bias threshold voltage ($V_{TB}$) of pass transistor 104. The low side voltage $V_L$ at node 120 is approximately equal to the voltage applied to bit line 111.

In write-disturb mode, an SRAM cell (not shown) which shares bit lines 111–112 with SRAM cell 100 is in the previously described write mode. Thus, in write-disturb mode, a low voltage ($V_{SS}$ ) is applied to word line 110, thereby turning off pass transistors 103 and 104. In addition, a high voltage ($V_{CC}$) is applied to the bit line which is coupled to the node 120–121 which is pulled down to a logic low voltage, and a low voltage ($V_{SS}$) is applied to the bit line which is coupled to the node 120–121 which is pulled up to a logic high voltage. Thus, in the described example, a high voltage ($V_{CC}$) is applied to bit line 111 and a low voltage ($V_{SS}$ ) is applied to bit line 112.

Under these conditions, the voltage difference between node 121 and bit line 112 is sufficient to cause subthreshold leakage current to flow from node 121 to bit line 112 through pass transistor 104. If this leakage current exceeds a certain level, the data value stored in SRAM cell 101 can be corrupted. The amount of subthreshold leakage current which flows through transistor 104 is proportional to the threshold voltage $V_T$ of pass transistor 104. It would therefore be desirable for pass transistor 104 (and pass transistor 103) to have a high threshold voltage to minimize subthreshold leakage current when SRAM cell 100 is in write-disturb mode.

In read mode, a high voltage ($V_{CC}$) is applied to word line 110, thereby turning on pass transistors 103 and 104. A high voltage ($V_{CC}$) is also applied to each of bit lines 111 and 112. Because pull-down transistor 101 is turned on by the high side voltage $V_H$ on node 121, read current flows from bit line 111 through pass transistor 103 and pull-down transistor 101. The low side voltage $V_L$ on node 120 during read mode is determined by the cell ratio of transistors 103 and 101. Cell ratio is defined as the on-resistance of transistor 103 over the on-resistance of transistor 101. Typically, transistors 103 and 101 have a cell ratio of approximately 3.5. Given such a cell ratio, the low side voltage $V_L$ at node 120 during read mode is approximately 0.5 volts.

A small read current also flows from bit line 112 to node 121 through pass transistor 104. The high side voltage $V_H$ at node 121 during read mode is approximately equal to the voltage applied to word line 110 ($V_{CC}$) minus the threshold voltage ($V_T$) of pass transistor 104. During a read operation, the data value stored in SRAM cell 100 is interpreted by sensing which of nodes 120–121 is at the high side voltage $V_H$ and which of nodes 120–121 is at the low side voltage $V_L$. Thus, a greater difference between the high side voltage $V_H$ and the low side voltage $V_L$ during a read operation results in a more reliable sensing of the data value stored in SRAM cell 100 and increased stability of SRAM cell 100. In read mode, it is therefore desirable to maximize the high side voltage $V_H$ at node 121. To maximize the high side voltage $V_H$ during a read operation, the backgate bias threshold voltage $V_{TB}$ of pass transistor 104 should be minimized. It would therefore be desirable for pass transistor 104 (and pass transistor 103) to have a low threshold voltage $V_T$ (and therefore, a low back bias threshold voltage $V_{TB}$) to maximize the high side voltage $V_H$ when SRAM cell 100 is in read mode.

A conflict therefore exists between the desired operation of pass transistors 103 and 104 during write-disturb mode and during read mode. During write-disturb mode, it is desirable for pass transistors 103 and 104 to have a high threshold voltage, while during read mode, it is desirable for pass transistors 103 and 104 to have a low threshold voltage. It would therefore be desirable to have a memory cell which resolves this conflict.

SUMMARY

Accordingly, the present invention provides a memory cell having one or more asymmetrical transistors which provide access to the storage circuitry of the memory cell. The asymmetrical transistors exhibit a forward threshold voltage $V_{TF}$ when forward biased, and a reverse threshold voltage $V_{TR}$ when reversed biased. The forward threshold voltage $V_{TF}$ is less than the reverse threshold voltage $V_{TR}$.

The asymmetrical transistors are connected such that during write-disturb mode, the asymmetrical transistors are reverse biased to provide a relatively high reverse threshold voltage $V_{TR}$. This high reverse threshold voltage $V_{TR}$ minimizes subthreshold current leakage during write-disturb mode, thereby reducing the possibility of data corruption.

During read mode, the asymmetrical transistors are forward biased to provide a relatively low forward threshold voltage $V_{TF}$. This low forward threshold voltage $V_{TF}$ maximizes the high side voltage $V_H$ applied to the storage circuitry through the asymmetrical transistor during a read operation. As a result, the stability of the memory cell is improved.

The present invention further includes a method of operating a memory cell having a data storage circuit. This method includes the step of accessing the data storage circuit through an asymmetrical transistor which has a first threshold voltage when forward biased and a second threshold voltage when reversed biased. The first threshold voltage is less than the second threshold voltage. The method can include the step of forward biasing the asymmetrical transistor during the read mode of the memory cell, thereby improving cell stability. The method can also include the step of reverse biasing the asymmetrical transistor during the write-disturb mode of the memory cell, thereby reducing subthreshold leakage current.

The present invention will be more fully understood in light of the following detailed description taken together with the drawings.

DETAILED DESCRIPTION

Figure 1:
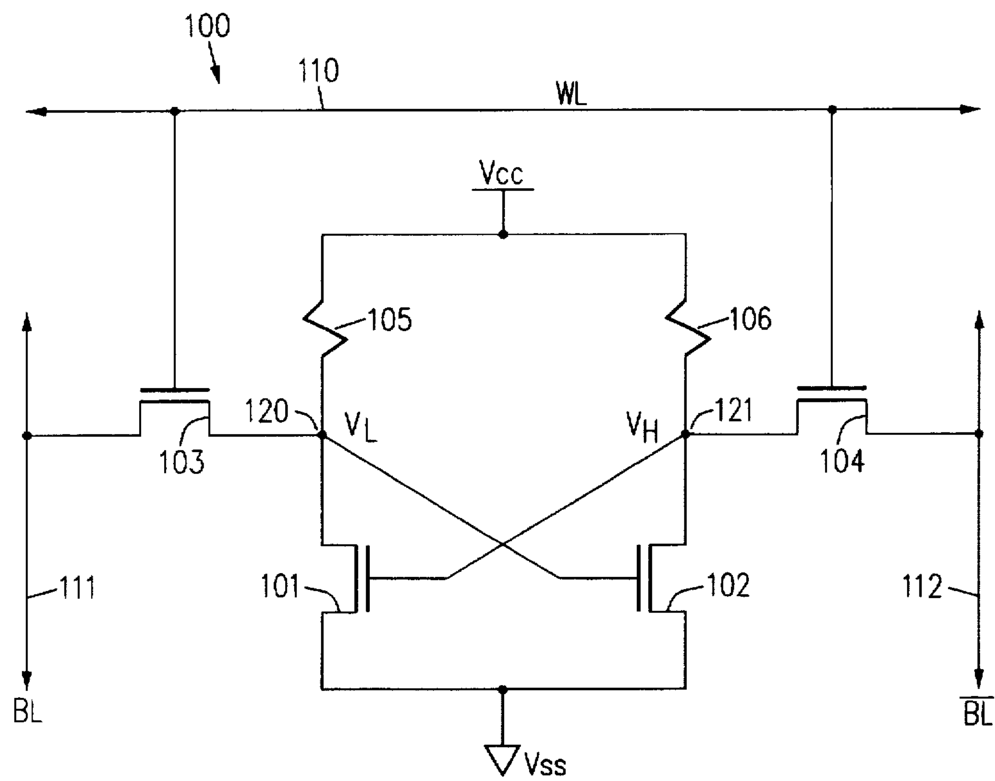
FIG. 1 is a circuit diagram of a conventional SRAM memory cell.
Figure 2:
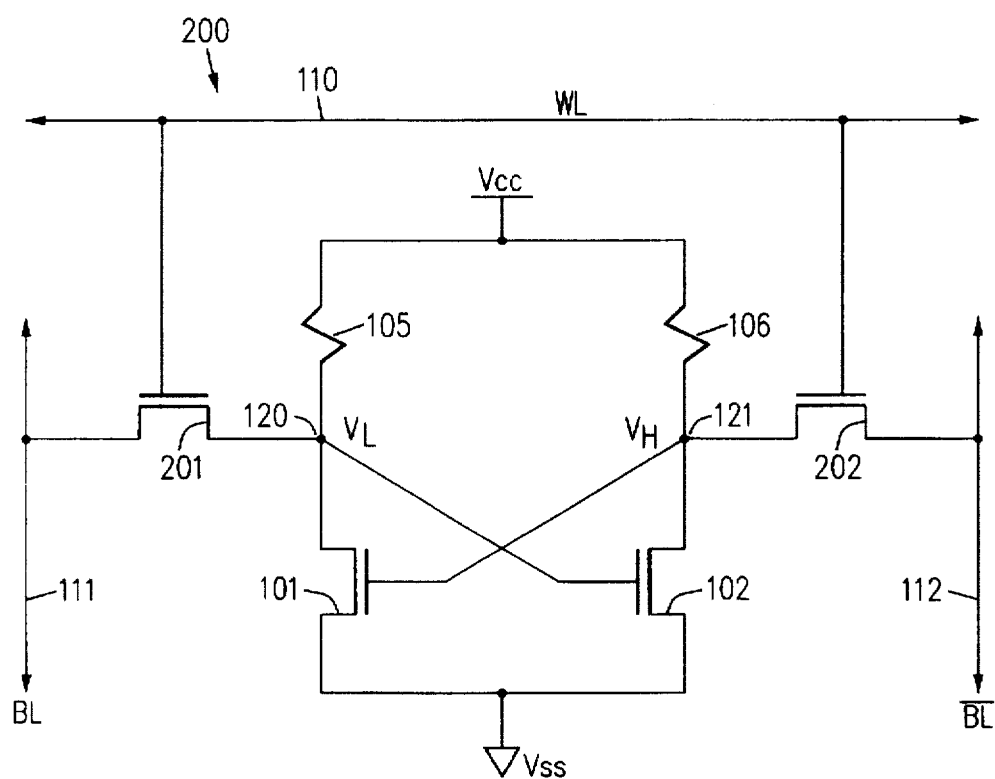
FIG. 2 is a circuit diagram of a memory cell having asymmetrical access transistors in accordance with the invention.

FIG. 2 is a circuit diagram illustrating a memory cell 200 in accordance with one embodiment of the invention. Because memory cell 200 is similar to memory cell 100, similar elements are labeled with similar reference numbers. Thus, memory cell 200 includes cross-coupled n-channel pull-down transistors 101–102, polycrystalline silicon load resistors 105–106, word line 110 and bit lines 111–112. Cross coupled transistors 101–102 and load resistors 105–106 form a data storage circuit which stores a data value.

Memory cell 200 also notably includes two asymmetrical n-channel pass transistors 201–202. An asymmetrical transistor is defined as a transistor which exhibits a first threshold voltage ($V_{TF}$) when biased in a forward direction, and which exhibits a second, substantially different, threshold voltage ($V_{TR}$) when biased in a reverse direction. Current flows in a first direction through a forward biased asymmetrical transistor. Conversely, current flows in a second direction (opposite the first direction) through a reverse biased asymmetrical transistor.

Figure 3:
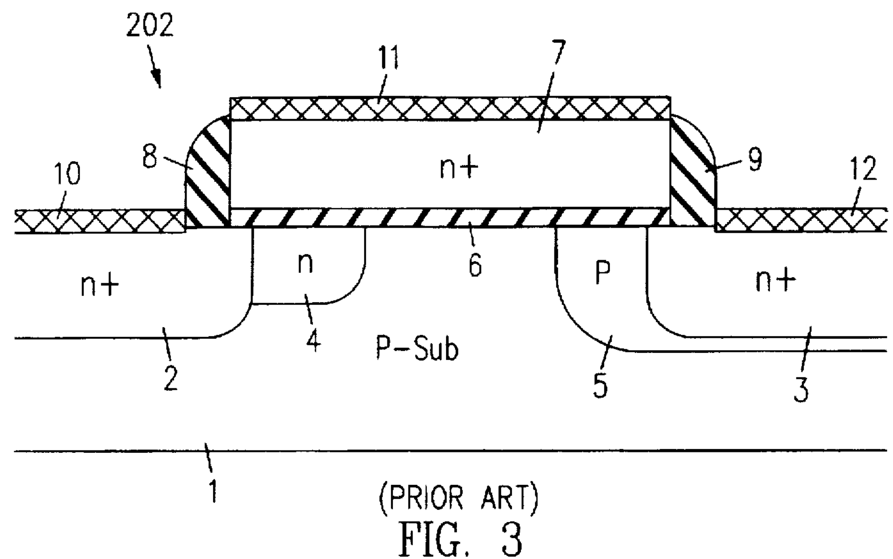
FIG. 3 is a cross sectional diagram of an asymmetrical transistor which can be used in the memory cell of FIG. 2

FIG. 3 is a cross sectional view of a conventional asymmetrical transistor 202 used in one embodiment of the invention. Asymmetrical transistor 202 includes p-monocrystalline semiconductor substrate 1, n+ drain region 2, n+ source region 3, n type gate-overlapped lightly doped drain (GOLD) region 4, p type halo source (HS) region 5, gate oxide layer 6, n+ polysilicon gate electrode 7, oxide spacers 8–9 and titanium silicide ($TiSi_2$) contact elements 10–12. In a particular embodiment, substrate 1 is monocrystalline silicon having a doping concentration of $1\times10^{16}$ $cm^{-3}$. GOLD region 4, which fully overlaps gate electrode 7 is formed using large tilt-angle (LAT) ion implantation. Another LAT ion implantation is used to produce a boron HS region 5. Except for the LAT implants, asymmetrical transistor 202 is formed using a conventional 0.5 μm n-MOSFET process with 120 Å gate oxide layer 6. Asymmetrical transistor 202 is described in more detail in Buti et al., "Asymmetrical Halo Source GOLD drain (HS-GOLD) Deep Sub-half-Micron n-MOSFET Design for Reliability and Performance" IEDM Proceedings 1989, pp. 26.2.1–26.2.4, hereby incorporated by reference. Asymmetrical transistor 202 can also be fabricated in a p-well region which resides in an n-type substrate.

Asymmetrical transistor 202 is defined as being forward biased when n type GOLD region 4 is biased as the source of the transistor. When transistor 202 is forward biased, this transistor 202 has a forward threshold voltage $V_{TF}$ of approximately 0.5 volts. Conversely, transistor 202 is defined as being reversed biased when n+ source region 3 is biased as the source of the transistor. When transistor 202 is reverse biased, this transistor 202 has a reverse threshold voltage $V_{TR}$ of approximately 0.7 volts. Thus, the forward threshold voltage $V_{TF}$ is less than the reverse threshold voltage $V_{TR}$.

Transistor 202 is connected within SRAM cell 200 such that n+ source region 3 is connected to bit line 112, gate electrode 7 is connected to word line 110 and n+ drain region 2 is connected to node 121. Asymmetrical transistor 201, which is substantially identical to asymmetrical transistor 202, has an n+ source region (similar to source region 3) connected to bit line 111, a gate electrode (similar to gate electrode 7) connected to word line 110 and an n+ drain region (similar to drain region 2) connected to node 120.

SRAM cell 200 operates in a manner which is similar to SRAM cell 100, with the following notable exceptions in the write-disturb mode and in the read mode.

For purposes of illustration, assume that in the write-disturb mode, node 121 is pulled up to the high side voltage $V_H$ (where $V_H=V_{CC}-V_R$), bit line 112 is at a low voltage ($V_{SS}$), and word line 110 provides a low voltage ($V_{SS}$) to gate electrode 7 of asymmetrical transistor 202. Under these conditions, asymmetrical transistor 202 is reverse biased. As a result, asymmetrical transistor 202 exhibits a reverse threshold voltage $V_{TR}$ having a relatively high value (e.g., $V_{TR}$=0.7 volts). This advantageously minimizes the subthreshold leakage current flowing from node 121 to bit line 112 through transistor 202. As a result, the probability that the data stored in SRAM cell 200 will be corrupted is reduced during write-disturb mode. Asymmetrical transistor 201 similarly minimizes the subthreshold leakage current flowing from node 120 to bit line 111 during write-disturb mode when node 120 is pulled up to the high side voltage $V_H$ and a low voltage is applied to bit line 111.

In the read mode, a high voltage ($V_{CC}$) is applied to each of bit lines 111 and 112, and word line 110 provides a high voltage ($V_{CC}$) to the gate electrodes of pass transistors 201 and 202. Under these conditions, each of asymmetrical transistors 201 and 202 is forward biased and exhibit a relatively low forward threshold voltage of approximately 0.5 volts. Again assume that node 121 is pulled up to the high side voltage $V_H$. Because the high side voltage $V_H$ at node 121 during a read operation is equal to the word line voltage ($V_{CC}$) minus the threshold voltage of transistor 202 ($V_{TF}$), the low forward threshold voltage $V_{TF}$ advantageously maximizes the high side voltage $V_H$ present at node 121 during read mode. Increasing the high side voltage $V_H$ at node 121 decreases the pull-down resistance of transistor 101, thereby advantageously lowering the low side voltage $V_L$. As a result of the increased high side voltage $V_H$ and the decreased low side voltage $V_L$, the stability of SRAM cell 200 is increased during read mode.

Asymmetrical transistor 201 similarly maximizes the high side voltage $V_H$ at node 120 when node 120 is pulled up to the high side voltage $V_H$ during read mode.

Other asymmetrical transistors can be substituted for transistors 201 and 202, as long as these asymmetrical transistors have a forward threshold voltage which is less than their reverse threshold voltage. In general, p-type halo region 5 (FIG. 3) provides the asymmetric threshold voltage characteristics to transistor 202. Thus, GOLD region 4 could be eliminated from transistor 202 in one variation of the previously described embodiment.

Figure 4:
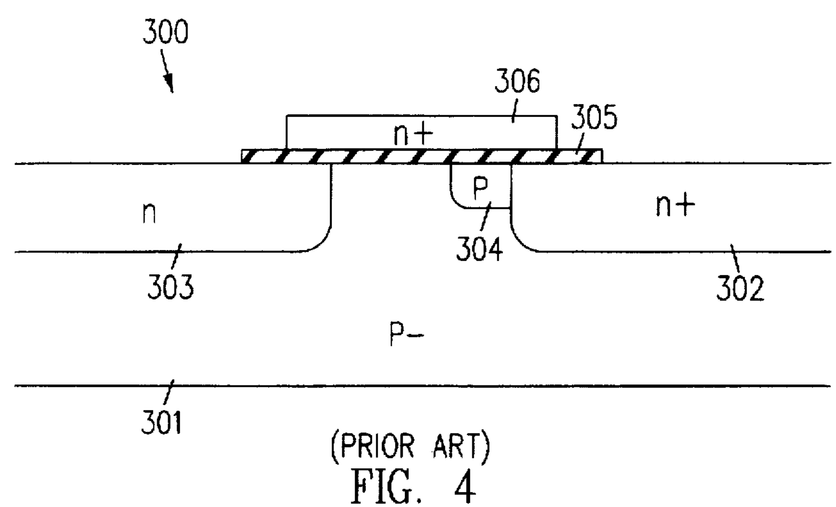
FIG. 4 is a cross sectional diagram of another asymmetrical transistor which can be used in the memory cell of FIG. 2.

FIG. 4 is a cross sectional view of an asymmetrical transistor 300 in accordance with another variation of the invention. Transistor 300 includes p-monocrystalline semiconductor substrate 301, n+ drain region 302, n type source region 303, p type interstitial gradient region 304, gate oxide layer 305 and n+ polysilicon gate electrode 306. P type region 304 is formed as a result of the n+ ion implant used to form drain region 302. This n+ ion implant causes damage which results in the formation of interstitials in substrate 301 adjacent to n+ drain region 302. The interstitials recombine at the gate oxide interface, creating an interstitial gradient and causing p type dopant to diffuse to the gate oxide interface, thereby resulting in p type region 304. This phenomenon is described in more detail in J. Lutze et al., "Techniques for Reducing the Reverse Short Channel Effect in Sub-0.5 μm CMOS", IEEE EDL vol. 16, no. 9, September 1995, pp. 373–375, which is hereby incorporated by reference.

Because, the n+ ion implant is only used to create drain region 302, but not source region 303, transistor 300 is an asymmetrical transistor. When used in place of transistor 202, transistor 300 is connected with drain region 302 connected to bit line 112, source region 303 connected to node 121, and gate electrode 306 connected to word line 110.

Figure 5:
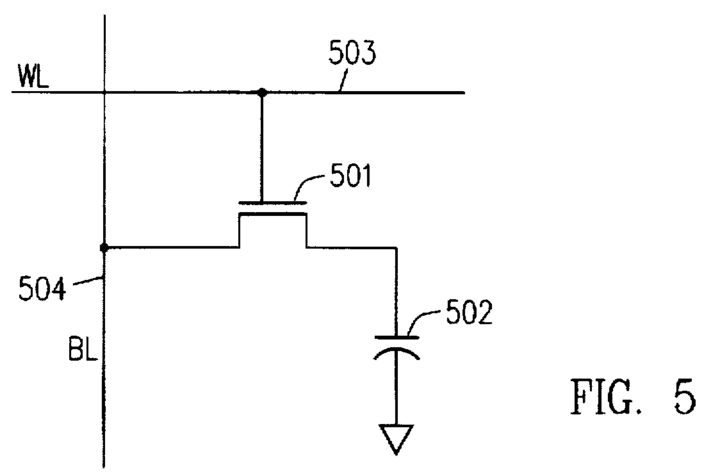
FIG. 5 is a circuit diagram of a memory cell having an asymmetrical access transistor in accordance with another embodiment of the invention.

FIG. 5 is a schematic diagram of a DRAM cell 500 in accordance with the present invention. DRAM cell 500 includes asymmetrical pass transistor 501, data storage capacitor 502, word line 503 and bit line 504. Asymmetrical transistor 501 is connected such that transistor 501 is forward biased during write mode. Thus, during write mode, when a high voltage is applied to word line 503, a high voltage is applied to bit line 504, and capacitor 503 stores a logic high voltage, transistor 501 provides a low threshold voltage. This advantageously results in the writing of a higher voltage into capacitor 502.

Asymmetrical transistor 501 is reverse biased during write disturb mode. Thus, during write disturb mode, when a low voltage is applied to word line 503, a low voltage is applied to bit line 504, and capacitor 503 stores a logic high voltage, transistor 501 provides a high threshold voltage. This advantageously prevents charge from leaking from capacitor 502 during write disturb mode.

Although the invention has been described in connection with several embodiments, it is understood that this invention is not limited to the embodiments disclosed, but is capable of various modifications which would be apparent to one of ordinary skill in the art. For example, asymmetrical transistors can be used to solve similar problems in other types of memory cells, flash EPROM and EEPROM cells. Asymmetrical transistors can also be used in multi-port memories, such as multi-port SRAM and multi-port DRAM. Operations of multi-port SRAM and multi-port DRAM are the same as those of standard SRAM and DRAM. Thus, the invention is limited only by the following claims.

What is claimed is:

1. A static random access memory (SRAM) cell comprising:

a storage circuit having a pair of cross coupled transistors and a node adapted to store a first voltage level and a second voltage level; and an asymmetrical transistor coupled to the storage circuit, the asymmetrical transistor being adapted to be turned on to provide access to the storage circuit, the asymmetrical transistor having a first threshold voltage when current flows through the asymmetrical transistor in a first direction, and a second threshold voltage when current flows through the asymmetrical transistor in a second direction, the first threshold voltage being less than the second threshold voltage.

2. The memory cell of claim 1, wherein the first direction of current flow is from the storage circuit to the asymmetrical transistor, and the second direction of current flow is from the asymmetrical transistor toward the storage circuit.

3. The memory cell of claim 1, wherein the asymmetrical transistor comprises:

a semiconductor substrate having a first conductivity type;

a drain region having a second conductivity type, opposite the first conductivity type, located in the substrate;

a source region having the second conductivity type located in the substrate and laterally separated from the drain region; and a halo region having the first conductivity type located in the substrate adjacent to the source region, the halo region being more heavily doped than the substrate.

4. The memory cell of claim 3, wherein the halo region is formed by a large tilt angle ion implantation.

5. The memory cell of claim 1, wherein the asymmetrical transistor comprises:

a semiconductor substrate having a first conductivity type;

a drain region having a second conductivity type, opposite the first conductivity type, located in the substrate, the drain region having a first dopant concentration;

a source region having the second conductivity type located in the substrate and laterally separated from the drain region, the source region having a second dopant concentration, the first dopant concentration being greater than the second dopant concentration; and a halo region having the first conductivity type located in the substrate adjacent to the drain region, the halo region being more heavily doped than the substrate.

6. A static random access memory cell comprising:

a first voltage supply rail for receiving a first supply voltage ($V_{CC}$);

a second voltage supply rail for receiving a second supply voltage ($V_{SS}$);

a word line;

a first bit line;

a second bit line;

a first control node;

a second control node;

a first field effect transistor (FET) having a gate electrode coupled to the second control node, a drain region coupled to the first control node, and a source region coupled to the second voltage supply rail;

a second FET having a gate electrode coupled to the first control node, a drain region coupled to the second control node, and a source region coupled to the second voltage supply rail;

a first resistive element coupled between the first control node and the first voltage supply rail;

a second resistive element coupled between the second control node and the first voltage supply rail;

a first asymmetrical pass transistor having a first source/drain region coupled to the first control node, a second source/drain region coupled to the first bit line and a gate electrode coupled to the word line; and a second asymmetrical pass transistor having a first source/drain region coupled to the second control node, a second source/drain region coupled to the second bit line, and a gate electrode coupled to the word line.

7. A method of operating a static random access memory cell having a data storage circuit, the method comprising the steps of:

accessing the data storage circuit through an asymmetrical transistor, the asymmetrical transistor having a first threshold voltage when forward biased and a second threshold voltage when reversed biased, the first threshold voltage being less than the second threshold voltage;

forward biasing the asymmetrical transistor during a read access; and reverse biasing the asymmetrical transistor during a write-disturb access.

* * * * *